(12) United States Patent
Pehlke

(10) Patent No.: US 12,615,022 B2
(45) Date of Patent: Apr. 28, 2026

(54) RADIO FREQUENCY FRONT END WITH DIFFERENTIAL PATHS

(71) Applicant: Skyworks Solutions, Inc., Irvine, CA (US)

(72) Inventor: David Richard Pehlke, Westlake Village, CA (US)

(73) Assignee: Skyworks Solutions, Inc., Irvine, CA (US)

(*) Notice: Subject to any disclaimer, the term of this patent is extended or adjusted under 35 U.S.C. 154(b) by 736 days.

(21) Appl. No.: 17/956,625

(22) Filed: Sep. 29, 2022

(65) Prior Publication Data

US 2023/0105554 A1 Apr. 6, 2023

Related U.S. Application Data

(60) Provisional application No. 63/251,500, filed on Oct. 1, 2021.

(51) Int. Cl.
| | |
|---|---|
| *H03F 3/195* | (2006.01) |
| *H03F 3/24* | (2006.01) |
| *H03F 3/45* | (2006.01) |
| *H03F 3/60* | (2006.01) |
| *H04B 1/00* | (2006.01) |
| *H04B 1/04* | (2006.01) |

(Continued)

(52) U.S. Cl.
CPC ............. *H03F 3/195* (2013.01); *H03F 3/245* (2013.01); *H03F 3/45475* (2013.01); *H03F 3/602* (2013.01); *H04B 1/0057* (2013.01); *H04B 1/0458* (2013.01); *H04B 1/18* (2013.01); *H04B 1/48* (2013.01); *H03F*

*2200/09* (2013.01); *H03F 2200/171* (2013.01); *H03F 2200/294* (2013.01); *H03F 2200/372* (2013.01); *H03F 2200/451* (2013.01); *H04B 2001/0408* (2013.01)

(58) Field of Classification Search
None
See application file for complete search history.

(56) References Cited

U.S. PATENT DOCUMENTS

| | | | |
|---|---|---|---|
| 9,866,196 | B2 | 1/2018 | Gorbachov |
| 10,305,432 | B1 | 5/2019 | Trayling et al. |
| 10,560,867 | B2 | 2/2020 | Khlat et al. |

(Continued)

OTHER PUBLICATIONS

U.S. Appl. No. 17/956,699, filed Sep. 29, 2022, Harmonic Cancellation in a Radio Frequency Front End.

*Primary Examiner* — Andrea Lindgren Baltzell
*Assistant Examiner* — Malane Lieng
(74) *Attorney, Agent, or Firm* — Knobbe, Martens, Olson & Bear, LLP

(57) ABSTRACT

A radio frequency circuit assembly architecture is disclosed. An example radio frequency circuit assembly architecture comprises a signal contact and an antenna contact, a power amplifier module connected in a signal path between the signal contact and the antenna contact, the signal path between the power amplifier module and the antenna contact including a differentially signaled portion having a first path and a second path, and a pair of band pass filters, a first band pass filter of the pair of band pass filters being connected in the first path of the differentially signaled portion and a second band pass filter of the pair of band pass filters being connected in the second path of the differentially signaled portion.

20 Claims, 9 Drawing Sheets

(51) Int. Cl.
    *H04B 1/18*     (2006.01)
    *H04B 1/48*     (2006.01)

(56)                References Cited

U.S. PATENT DOCUMENTS

| | | |
|---|---|---|
| 10,903,818 B2 | 1/2021 | Nair et al. |
| 11,411,596 B1 | 8/2022 | Lin |
| 11,616,485 B2 | 3/2023 | Azizi |
| 2011/0140784 A1 | 6/2011 | Tajima et al. |
| 2012/0188010 A1 | 7/2012 | Wakejima |
| 2015/0295559 A1 | 10/2015 | White et al. |
| 2018/0041194 A1 | 2/2018 | Ito et al. |
| 2019/0013780 A1* | 1/2019 | Amiot ..................... H03F 1/565 |
| 2020/0412403 A1 | 12/2020 | Pehlke |
| 2021/0028813 A1 | 1/2021 | Pehlke |
| 2021/0143795 A1 | 5/2021 | Azizi |
| 2021/0203376 A1 | 7/2021 | Pehlke |
| 2023/0006651 A1 | 1/2023 | Chen et al. |
| 2023/0107913 A1 | 4/2023 | Pehlke |
| 2023/0112435 A1 | 4/2023 | Abadi et al. |
| 2023/0140451 A1 | 5/2023 | Brewer |
| 2024/0146261 A1 | 5/2024 | Hanaoka |

* cited by examiner

50

52a

52b

52c

52g

53

52d

52e

52f

1

$f_{DL1}$ $f_{DL2}$ $f_{DL3}$ $f_{DL4}$ $f_{DL5}$

DL $f_{UL1}$ $f_{UL2}$ $f_{UL3}$

UL

61

62

RADIO FREQUENCY FRONT END WITH DIFFERENTIAL PATHS

CROSS REFERENCE TO PRIORITY APPLICATIONS

Any and all applications for which a foreign or domestic priority claim is identified in the Application Data Sheet as filed with the present application are hereby incorporated by reference under 37 C.F.R. § 1.57.

BACKGROUND

Field

Embodiments of this disclosure relate to power amplifier architectures including filters for use in radio frequency electronic systems.

Description of the Related Technology

Power amplifier architectures may be integrated into wireless front-end modules for the processing of signals to be transmitted or received over radio frequency communication. These power amplifier architectures may be implemented using one or more single ended power amplifiers, or alternatively differential power amplifiers may be implemented using a push-pull topology.

Power amplifier architectures are known to experience performance degradation in wireless front-end modules, for example due to self-generated carrier signals, noise from external sources, and other spurious emissions. Many wireless communications devices also include multiple transmitter channels that, for example due to their proximity, can interfere with each other. In addition, external nearby wireless devices create interference that may further cause performance degradation in a given front-end module.

In order to attempt to combat these performance issues, power amplifier architectures for use in radio frequency circuits may be selected to use a differential topology in the power amplifier, which provides natural isolation from radio frequency interference. The differential output of the differential amplifier must then be converted back into a single ended signal in order to be able to subsequently feed the radio frequency transceiver antenna. This conversion is achieved using a balun (for example a transformer balun) to convert the balanced output signal of the differential amplifier into an unbalanced signal for further processing. This further processing includes filtering, for example the use of band pass filtering at transmit filters or receive filters.

SUMMARY

According to one embodiment there is provided, a radio frequency circuit assembly architecture, comprising a signal contact, an antenna contact, a power amplifier module connected in a signal path between the signal contact and the antenna contact, and a pair of band pass filters. The signal path between the power amplifier module and the antenna contact includes a differentially signaled portion having a first path and a second path. A first band pass filter of the pair of band pass filters is connected in the first path of the differentially signaled portion and a second band pass filter of the pair of band pass filters is connected in the second path of the differentially signaled portion.

In one example, the first band pass filter and the second band pass filter are coupled to form a differential filter.

In one example, the first band pass filter and the second band pass filter are acoustic wave filters.

In one example, the first band pass filter and the second band pass filter are bulk acoustic wave filters.

In one example, the power amplifier module is a single ended power amplifier module.

In one example, the radio frequency circuit assembly architecture may further comprise a band select switch coupled to a single ended output of the single ended power amplifier module.

In one example, the radio frequency circuit assembly architecture may further comprise an antenna switch module connected in the signal path between the single ended output of the differentially signaled portion and the antenna contact.

In one example the power amplifier module is a differential power amplifier module.

In one example, the radio frequency circuit assembly architecture may further comprise a pair of band select switches coupled to the respective differential outputs of the differential power amplifier module.

In one example, the radio frequency circuit assembly architecture may further comprise a pair of antenna switch modules each coupled to the antenna contact and to a respective output of the first band pass filter and the second band pass filter.

In one example, the radio frequency circuit assembly architecture may further comprise a pair of antenna switch modules. The pair of band pass filters may be coupled to the respective outputs of the pair of band select switches. The pair of antenna switch modules may be coupled to the respective outputs of the pair of band pass filters. The pair of antenna switch modules may be coupled to the antenna contact.

In one example, the radio frequency circuit assembly architecture may further comprise a tunable low pass filter connected in the signal path between the single ended output of the differentially signaled portion and the antenna contact.

In one example, the signal contact is a transmit contact and the signal path is a transmit path.

In one example, the power amplifier module is a low noise amplifier module, the signal contact is a receive contact, and the signal path is a receive path.

According to another embodiment, there is provided a front-end module comprising a signal contact, an antenna contact, a power amplifier module connected in a signal path between the signal contact and the antenna contact, and a pair of band pass filters. The signal path between the power amplifier module and the antenna contact includes a differentially signaled portion having a first path and a second path. A first band pass filter of the pair of band pass filters is connected in the first path of the differentially signaled portion and a second band pass filter of the pair of band pass filters is connected in the second path of the differentially signaled portion.

In one example, the first band pass filter and the second band pass filter are coupled to form a differential filter.

In one example, the first band pass filter and the second band pass filter are acoustic wave filters.

In one example, the first band pass filter and the second band pass filter are bulk acoustic wave filters.

In one example, the power amplifier module is a single ended power amplifier module.

In one example, the radio frequency circuit assembly architecture may further comprise a band select switch coupled to a single ended output of the single ended power amplifier module.

In one example, the front-end module may further comprise an antenna switch module connected in the signal path between the single ended output of the differentially signaled portion and the antenna contact.

In one example the power amplifier module is a differential power amplifier module.

In one example, the front-end module may further comprise a pair of band select switches coupled to the respective differential outputs of the differential power amplifier module.

In one example, the front-end module may further comprise a pair of antenna switch modules each coupled to the antenna contact and to a respective output of the first band pass filter and the second band pass filter.

In one example, the front-end module may further comprise a pair of antenna switch modules. The pair of band pass filters may be coupled to the respective outputs of the pair of band select switches. The pair of antenna switch modules may be coupled to the respective outputs of the pair of band pass filters. The pair of antenna switch modules may be coupled to the antenna contact.

In one example, the front-end module may further comprise a tunable low pass filter connected in the signal path between the single ended output of the differentially signaled portion and the antenna contact.

In one example, the signal contact is a transmit contact and the signal path is a transmit path.

In one example, the power amplifier module is a low noise amplifier module, the signal contact is a receive contact, and the signal path is a receive path.

According to another embodiment, there is provided a wireless communication device comprising a signal contact, an antenna contact, a power amplifier module connected in a signal path between the signal contact and the antenna contact, a pair of band pass filters, and an antenna. The signal path between the power amplifier module and the antenna contact includes a differentially signaled portion having a first path and a second path. A first band pass filter of the pair of band pass filters is connected in the first path of the differentially signaled portion and a second band pass filter of the pair of band pass filters is connected in the second path of the differentially signaled portion. The antenna is configured to receive and transmit radio frequency signals, and is coupled to the antenna contact.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the disclosure. In the figures, each identical or nearly identical component that is illustrated in various figures is represented by a like numeral. For purposes of clarity, not every component may be labeled in every figure. In the figures.

DETAILED DESCRIPTION

Aspects and embodiments described herein are directed to a radio frequency circuit assembly architecture having a pair of band pass filters arranged in the respective first and second paths of a differentially signaled portion of a power amplifier signal path, between a power amplifier module and an antenna contact for connecting an antenna. This provides improved resistance of the circuit to undesirable frequency components, such as intermodulation distortion including additional frequency components at certain harmonic frequencies. This in turn eliminates or reduces the need for further filtering at the end of the radio frequency circuit assembly architecture signal chain, which has been found to reduce the overall insertion losses in-band for the radio frequency circuit assembly architecture.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

Figure 1:
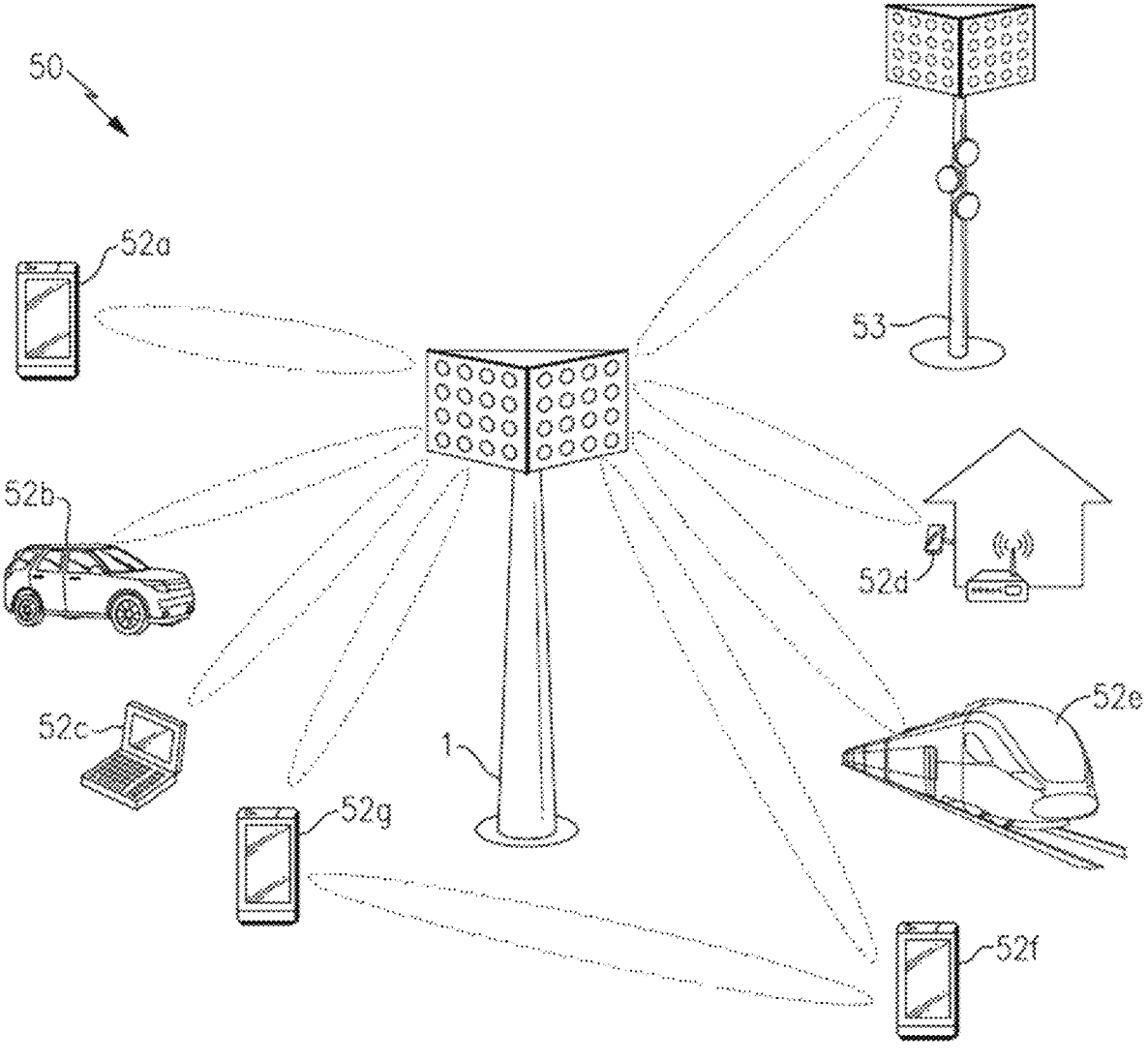
FIG. 1 is a schematic diagram of one example of a communication network.

FIG. 1 is a schematic diagram of one example of a communication network 50. The communication network 50 includes a macro cell base station 1, a small cell base station 53, and various examples of user equipment (UE), including a first mobile device 52a, a wireless-connected car 52b, a laptop 52c, a stationary wireless device 52d, a wireless-connected train 52e, a second mobile device 52f, and a third mobile device 52g.

Although specific examples of base stations and user equipment are illustrated in FIG. 1, a communication network can include base stations and user equipment of a wide variety of types and/or numbers.

For instance, in the example shown, the communication network 50 includes the macro cell base station 1 and the small cell base station 53. The small cell base station 53 can operate with relatively lower power, shorter range, and/or with fewer concurrent users relative to the macro cell base station 1. The small cell base station 53 can also be referred to as a femtocell, a picocell, or a microcell. Although the communication network 50 is illustrated as including two base stations, the communication network 50 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 50 of FIG. 1 supports communications using a variety of cellular technologies, including, for example, 4G LTE and 5G NR. In certain implementations, the communication network 50 is further adapted to provide a wireless local area network (WLAN), such as WiFi. Although various examples of communication technologies have been provided, the communication network 50 can be adapted to support a wide variety of communication technologies.

Various communication links of the communication network 50 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 1, the communication links include not only communication links between UE and base stations, but also UE to UE communications and base station to base station communications. For example, the communication network 50 can be implemented to support self-fronthaul and/or self-backhaul (for instance, as between mobile device 52g and mobile device 52f).

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. For example, the communication links can serve Frequency Range 1 (FR1), Frequency Range 2 (FR2), or a combination thereof. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz.

Different users of the communication network 50 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 50 of FIG. 1 can be used to support a wide variety of advanced communication features, including, but not limited to, eMBB, uRLLC, and/or mMTC.

Figure 2:
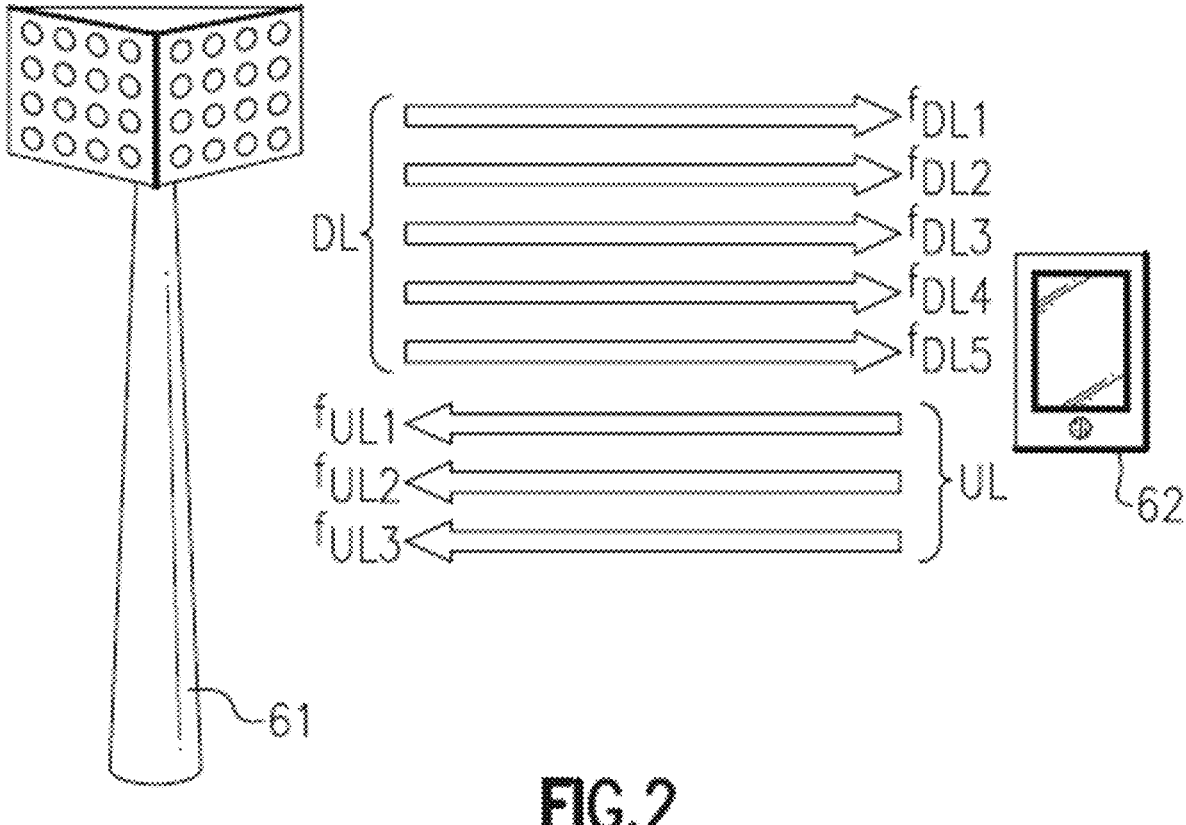
FIG. 2 is a schematic diagram of one example of a communication link using carrier aggregation.

FIG. 2 is a schematic diagram of one example of a communication link using carrier aggregation. Carrier aggregation can be used to widen bandwidth of the communication link by supporting communications between a base station and a mobile device using multiple carrier frequencies, thereby increasing the rate of data transmission between the base station and the mobile device resulting in enhanced network capacity by utilizing fragmented spectrum allocations.

In the illustrated example, the communication link is provided between a base station 61 and a mobile device 62. As shown in FIG. 2, the communications link includes a downlink channel (DL) used for RF communications from the base station 61 to the mobile device 62, and an uplink (UL) channel used for RF communications from the mobile device 62 to the base station 61.

Although FIG. 2 illustrates carrier aggregation in the context of FDD communications, carrier aggregation can also be used for TDD communications.

In certain implementations, a communication link can provide asymmetrical data rates for a downlink channel and an uplink channel. For example, a communication link can be used to support a relatively high downlink data rate to enable high speed streaming of multimedia content to a mobile device, while providing a relatively slower data rate for uploading data from the mobile device to the cloud.

In the illustrated example, the base station 61 and the mobile device 62 communicate via carrier aggregation, which can be used to selectively increase bandwidth of the communication link. Carrier aggregation includes contiguous aggregation, in which contiguous carriers within the same operating frequency band are aggregated. Carrier aggregation can also be non-contiguous, and can include carriers separated in frequency within a common band or in different bands.

In the example shown in FIG. 2, the uplink channel includes three aggregated component carriers $f_{UL1}$, $f_{UL2}$, and $f_{UL3}$. Additionally, the downlink channel includes five aggregated component carriers $f_{DL1}$, $f_{DL2}$, $f_{DL3}$, $f_{DL4}$, and $f_{DL5}$. Although one example of component carrier aggregation is shown, more or fewer carriers can be aggregated for uplink and/or downlink. Moreover, a number of aggregated carriers can be varied over time to achieve desired uplink and downlink data rates.

For example, a number of aggregated carriers for uplink and/or downlink communications with respect to a particular mobile device can change over time. For example, the number of aggregated carriers can change as the device moves through the communication network and/or as network usage changes over time.

Figure 3:
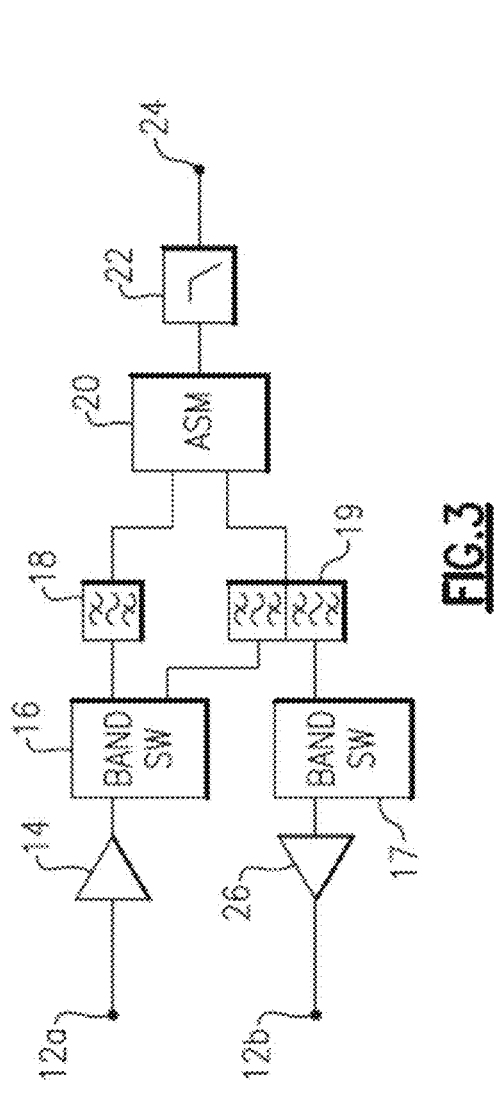
FIG. 3 is an example block diagram of a front-end module for a radio frequency communications device including a single ended power amplifier.

Radio frequency circuit assembly architectures typically involve a power amplifier as well as a band pass filter for highly selective radio frequency filtering. An example front-end module for a radio frequency communications device including such a radio frequency circuit assembly is illustrated in FIG. 3. The example front-end module comprises signal contacts 12 (12a, 12b), a single ended power amplifier 14, band select switches 16 and 17, band pass filters 18 and 19, an antenna switch module 20, a low pass filter 22, an antenna contact 24, and a low noise amplifier (LNA) 26.

The signal contact 12a may be configured to receive a radio frequency (RF) signal to be amplified, which is then passed to the single ended power amplifier 14 for amplification. The single ended power amplifier may be configured to operate in a broadband mode, amplifying all frequency ranges that are to be transmitted via the antenna contact 24 and corresponding antenna. However, frequency specific paths may be implemented for processing one or more defined frequency bands. Accordingly, the band select switch 16 may act to route the relevant frequency components of the broadband RF signal to respective frequency specific paths, which may have respective band pass filters 18, 19 tuned to pass the relevant in-band frequencies of the respective paths.

These frequency specific paths may utilize time-division duplexing (TDD) with a single filter configured to the relevant transmit/receive (Tx/Rx) frequency band, such as illustrated in the band pass filter 18 shown in FIG. 3 (receive connection to LNA 26 via transmit/receive switch not shown for clarity), or they may utilize frequency-division duplexing (FDD), such as shown for band pass filter 19 (including one filter component configured for the Tx path and another filter component configured for the Rx path) in FIG. 3. These disparate frequency specific paths may then be routed to the antenna switch module 20, which acts to select which one or more of these paths are coupled to the antenna contact 24 at any one point in time.

Conversely, for the Rx path, the RF signal received at the antenna contact 24 is coupled to the antenna switch module 20, which then directs the RF signal to the relevant Rx path (based on whether TDD or FDD is in use). This Rx path includes an Rx filter (shown as being included in band pass filter 19), with the signal being routed to the correct LNA 26 by the band select switch 17. The amplified output of the LNA may then be output from the front-end module at signal contact 12b.

Front-end modules based on such configurations of radio frequency circuit assembly architecture are known to experience in-band interference in the transceivers due to non-linearities in the active electronics, and it is desirable to reduce or eliminate such interference in-band as well as to meet out-of-band isolation and attenuation requirements for RF operation. To address these issues a further filter 22 is typically included between the antenna switch module 20 and the antenna contact 24 to combat the cumulated interference generated by each of the sources (also known as aggressors) of the interference prior to that point in the signal chain. However, in configuring this further filter 22, consideration must be taken of the performance trade-off due to in-band insertion losses caused by the insertion of the filter into the RF signal path. The more aggressive the filter is in filtering out spurious signals, the higher the insertion losses would be expected to be. This in turn impacts the power capability, since more power must be consumed in the amplification on the Tx path in order to achieve the same antenna power. Correspondingly, on the Rx side, the receive sensitivity is impaired due to the increased noise component. This further filter 22 may be a low pass filter as illustrated in FIG. 3, or alternatively it may be configured to be a further band pass filter.

Figure 4:
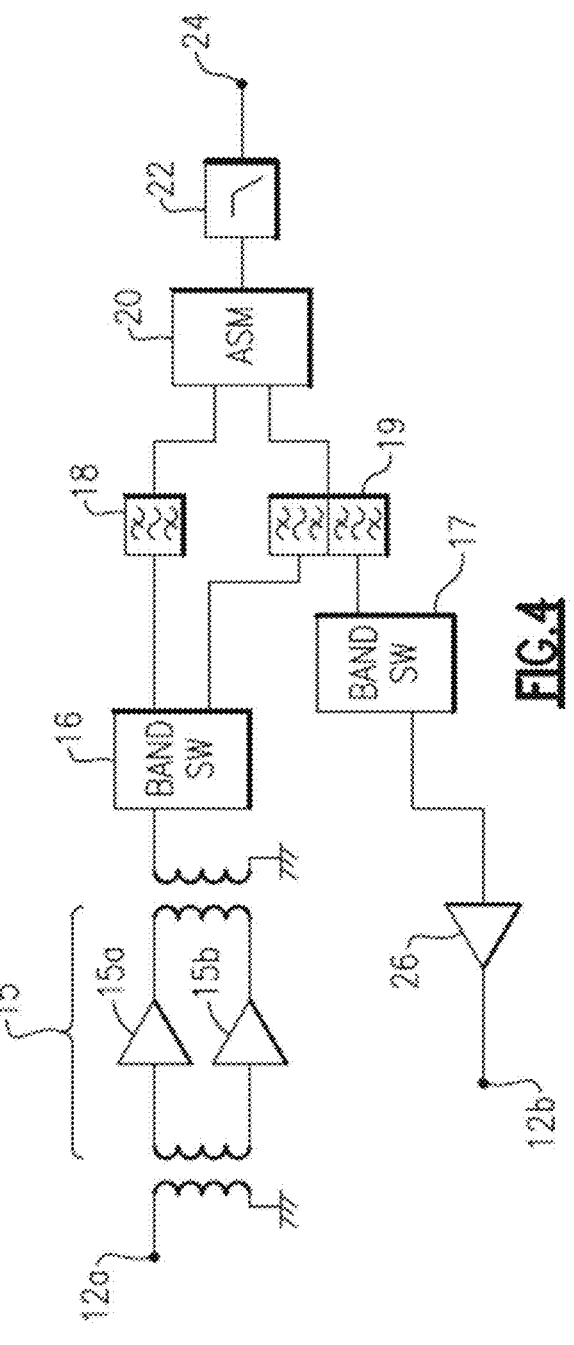
FIG. 4 is an example block diagram of a front-end module for a radio frequency communications device including a differential power amplifier.

A further example of a front-end module for a radio frequency communications device including a radio frequency circuit assembly is illustrated in FIG. 4. The radio frequency circuit assembly of FIG. 4 is the same as that of FIG. 3, with the exception that the single ended power amplifier 14 has been replaced with a differential power amplifier 15. As can be seen from FIG. 4, the differential power amplifier 15 comprises a first fundamental power amplifier 15*a* and a second fundamental power amplifier 15*b* that are configured in a push-pull topology. In order to interface with the single ended signal contact 12*a* and the input pole of the band switch, baluns are provided to convert the RF signal chain from unbalanced to balanced at the input side of the differential power amplifier 15, and from balanced to unbalanced at the output side of the differential power amplifier 15.

Although two paths with respective band pass filters 18 and 19 are shown in the examples of FIGS. 3 and 4, it will be appreciated that configurations may include a single path with a single band pass filter for single band operation, or more than two paths and band pass filters for alternative multi-band operation. While the example front-end modules of FIGS. 3 and 4 are illustrated as using a broadband power amplifier 14, 15 in combination with band select switches 16, 17 to provide multi-band operation, it will be appreciated that individual power amplifiers may be used for each frequency band to be operated. In this case, the band select switches 16, 17 can be omitted as the individual power amplifiers and band pass filters would be matched in a 1:1 relationship. It will further be appreciated that the front-end module may be configured to operate in a single band, in which case both the band select switches 16, 17 and the antenna switch module 20 may be omitted from the front-end module.

Implementing a differential power amplifier 15 in the radio frequency circuit assembly improves the RF isolation of the circuit due to the inherent rejection of common-mode signals. Moreover, RF power amplifier are typically driven at high power and high efficiency, which causes the power amplifier to operate as a non-linear device. As a result, the amplification of the RF signal by the power amplifier introduces spurious signal components, such as harmonic distortion. While not shown in FIG. 3 or 4, it will be appreciated that the LNA 26 in the Rx chain may be implemented as a differential amplifier in either of FIG. 3 or 4.

Harmonic distortion can be particularly problematic in devices including radio frequency circuit assemblies and radio frequency front-end modules because the harmonics generated by one Tx chain may be within a neighboring frequency range that is also being used as a signal frequency, for example that of another Tx chain or Rx chain—potentially an active receiver within the same device. In this example, the frequencies of the Tx band that undesirably reach the Rx channel can significantly degrade the sensitivity of the receiver as a function of that leakage power causing receiver "desense", which is the difference in receiver sensitivity between the situation where the transmitter is in the ON state and the situation where the transmitted is in the OFF state. This increases the noise floor on the Rx channel and thus also increases the minimum detectable signal (i.e. reducing the sensitivity of the receiver).

Implementing the radio frequency circuit assembly with a differential power amplifier enables the circuit to reduce the contribution of spurious signal components added by the non-linear power amplifier before they reach a victim component, such as a concurrent receive channel. As an example, the contribution of even harmonics caused by the operation of the fundamental power amplifiers 15*a* and 15*b* to the spurious signal correspond to the even power components of the input voltage, i.e. the RF signal to be amplified. This means that the value of the contribution from the even harmonics would be expected to be the same (with idealized components) at the outputs of both fundamental power amplifiers (since the polarity of the inverted signal will be cancelled by the even power) and thus the even harmonic contribution will be substantially cancelled during the differential subtraction as the respective signals are recombined.

As in the case of the single ended implementation of FIG. 3, a further filter 22 is typically included in the example front-end module of FIG. 4 between the antenna switch module 20 and the antenna contact 24 to further combat the interference generated by each of the sources, or aggressors, of the interference prior to that point in the signal chain.

Certain system level linearity specifications have stringent second order harmonic emissions specifications. As one example, a stringent specification can be that a radio frequency system achieves second order harmonic emissions of less than −90 dBc.

While non-linear active electronics (for example bipolar junction transistors and field-effect transistors/metal-oxide-semiconductor field-effect transistors) are known to be sources of harmonics in the RF signal chain, with the power amplifier being one of the strongest sources, the inventor has appreciated that passive components of the radio frequency circuit assembly may also contribute intermodulation distortion (IMD) in response to multiple incoming signals and self-generate their own harmonics in the RF signal being amplified by the circuit.

In particular, it has been found that the band pass filters, for example acoustic wave filters, used in the radio frequency circuit assembly may also contribute to harmonic distortion. In certain RF applications, the acoustic wave filter may be chosen to be a bulk acoustic wave (BAW) filter. For example, due to the processing of high frequency signals, and the enhanced characteristics of BAW filters, such as the improved power handling capability and the high Q factor for filtering, use of BAW filters can result in improved attenuation at the target frequency range with reduced attenuation in the operational band.

For BAW filters, it has been found that the second order harmonic emission can be generated from a main mode, a lateral mode, a recessed frame mode, the like, or any suitable combination thereof. The second order harmonic emission has been found to be generated particularly strongly in BAW filters in comparison to other types of acoustic wave resonators, for example surface acoustic wave (SAW) filters, and other passive components in the radio frequency circuit assembly and the resulting front-end module. This second order harmonic emission may be particularly problematic because not only will it be the highest power harmonic contribution in this case, but it will also be that with the closest frequency to the fundamental frequency of operation and any neighboring frequency channels.

Figure 12:
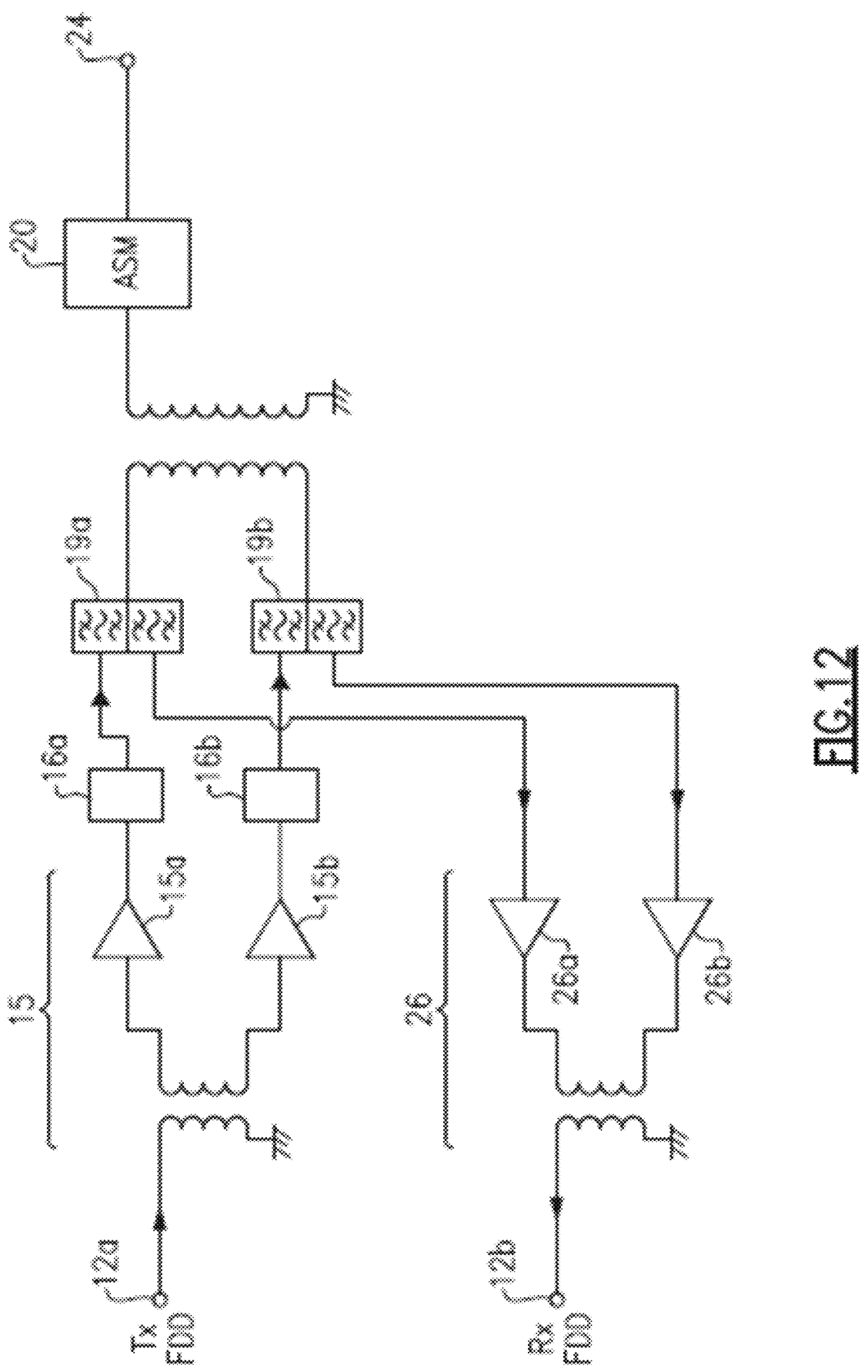
FIG. 12 and FIGS. 13A-13B are block diagrams additional examples radio frequency circuit assemblies according to aspects of the present disclosure, including differential signal paths in both transmit and receive paths.

According to certain embodiments, the contribution of harmonic distortion and other spurious signal components added to the RF signal to be amplified during processing in the radio frequency circuit assembly can be reduced by arranging the band pass filters 18 and/or 19 in a differential topology by using two band pass filters 18 and/or two band pass filters 19. An example radio frequency circuit assembly architecture is shown for a single Tx path in FIG. 5. While the following discussion will focus on this example of a Tx path, it will be appreciated that the following teaching may also be applied to a Rx path in a radio frequency circuit assembly architecture of a front-end module. In the case of a Rx path, the differential power amplifier 15 would be replaced with a differential LNA and the signal contact 12*a* would then be a signal contact 12*b* for outputting the amplified received signal. FIGS. 12 and 13, described below, show examples of embodiments where differential LNAs are used in Rx paths.

Figure 5:
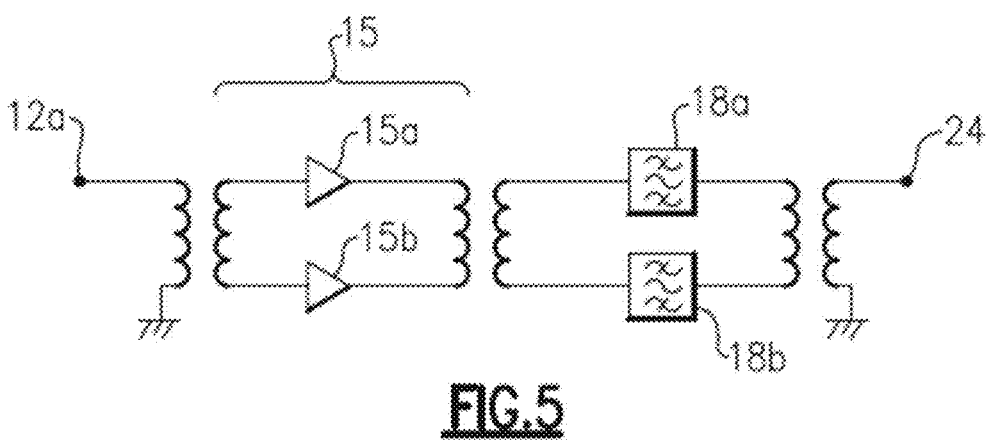
FIG. 5 is a block diagram of one example radio frequency circuit assembly according to aspects of the present disclosure.

Using common reference numerals, the architecture of FIG. 5 comprises a signal contact 12*a*, a differential power amplifier 15 having a first fundamental power amplifier 15*a* and a second fundamental power amplifier 15*b* arranged differentially, a pair of band pass filters 18*a* and 18*b*, and an antenna contact 24. The signal contact receives a single ended RF signal to be amplified, which is then passed to a balun for conversion into a differential signal over a pair of paths. This pair of paths then feed the first fundamental power amplifier 15*a* and the second fundamental power amplifier 15*b* respectively in a push-pull topology.

In FIG. 5, the differential output of the differential power amplifier 15 is then passed to a further differentially signaled portion via an output match imposed by a further balun. This differentially signaled portion includes the differentially arranged pair of band pass filters 18*a*, 18*b*. Specifically, the differentially signaled portion has a first path and a second path with a first band pass filter 18*a* of the pair of band pass filters arranged in the first path and a second band pass filter 18*b* of the pair of band pass filters arranged in the second path. The first and second band pass filters 18*a*, 18*b* may be chosen to be filters of the same type and configuration so that they are designed to perform the same operations on the respective differential signals received via the first and second paths. While the first and second filters may not be identical in practice, it can be desirable for their characteristics to match closely. In this manner any even order harmonic contributions to the amplified RF signal added by the pair of band pass filters 18*a*, 18*b* would be expected to be substantially common to both the first and second signal paths. Accordingly, these even order harmonic contributions would then be substantially cancelled or reduced at the balun that receives the respective signals from the first and second band pass filters for conversion to a single ended signal. As shown in FIG. 5, this balun is configured to convert the balanced signal into a single ended unbalanced signal for feeding the antenna contact 24, which may then be used to feed an antenna for RF transmission.

In this manner, even order harmonic distortion, such as the second order harmonics that have been found to be particularly problematic in BAW filters 18*a*, 18*b*, can be locally cancelled out by the differential filter formed of first and second BAW filters 18*a*, 18*b* so as to prevent leakage to any victims in the signal chain. Moreover, the RF isolation of the overall radio frequency circuit assembly from external sources of interference is improved, as well as reducing the leakage of the Tx chain of the radio frequency circuit assembly to other victims (since the differential signals on the pair of paths/branches in the radio frequency circuit assembly will cancel each other out in the far field).

Furthermore, the implementation of the differential filter arranged across the two paths will also cause the power of the radio frequency circuit assembly to be split across the two paths. This can then be used to either improve the power handling capability of the circuit, or to simply reduce the amount of power passing through each of the band pass filters 18*a*, 18*b*, such that the generation of harmonics in the filters is also reduced.

Using the noise cancellation technique disclosed herein may allow relaxation of the filtering requirements on other filter components in the front-end module, making production of such components easier or less expensive, and improving the overall performance of the front-end module. For example, an equivalent filter to the further filter 22 of FIGS. 5 and 6 may be omitted from the circuit architecture (as shown in FIG. 5), or alternatively the filtering provided by such a filter 22 may be much less aggressive and therefore introduce less insertion loss into the signal chain.

As noted above, these techniques can be applied in the transmit path, for example, to increase or improve filtering out of receiver-band noise produced by transmitter leakage and component noise as well as interference on the transmit signal. Similarly, the noise cancellation technique can be applied in the receive path to increase or improve filtering out of receiver band noise from the transmit path or other nearby devices.

It will be appreciated that the introduction of pairs of filters rather than single filters in the chain will introduce additional component cost and architecture complexity to the circuit, but this has been found to be desirable for the improved isolation and reduced leakage and harmonic generation provided. Accordingly, the present disclosure enables BAW filters to be implemented in radio frequency circuit assemblies, and resulting devices, with less loss, better performance and much lower generation of even order harmonics, particularly the second order harmonic for example.

While the above disclosure has been described in the context of the benefits for radio frequency circuit assemblies using BAW filters, it has been appreciated that other types of filter may also generate such interference from even order harmonics and thus the teaching of the present disclosure also applies to other filter technologies. For example, SAW filters have been found to produce a particularly strong response at the third order harmonic frequency for an input signal; however, SAW filters typically do still generate even order harmonics and so the present disclosure may also be utilized with SAW filter technology.

The example configuration of FIG. 5 illustrated a single differential power amplifier stage 15 coupled with a differential filter stage 18*a*, 18*b* for receiving a signal to be amplifier at signal contact 12*a* and outputting the amplified signal at the antenna contact 24. This configuration is suitable to RF amplification of a single frequency band; however it is common for devices to implement front-end modules that are operational across multiple bands.

Figure 6:
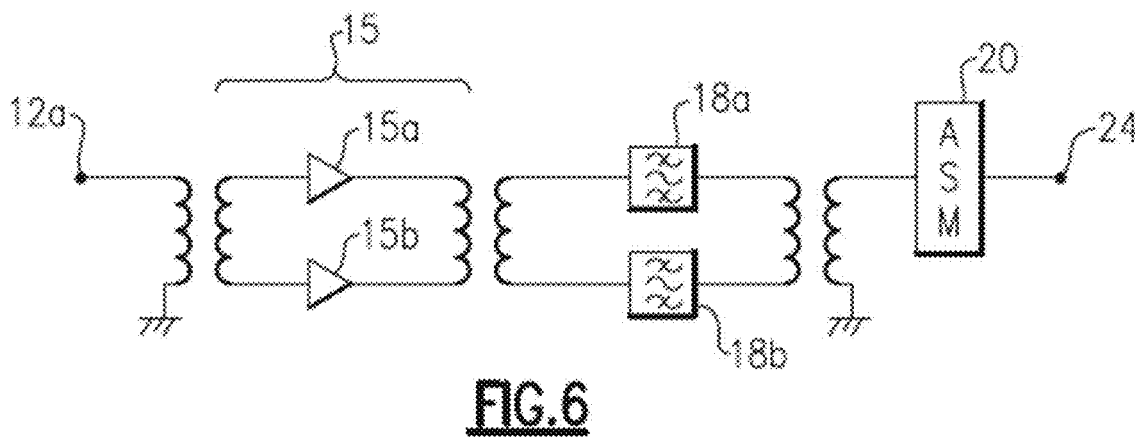
FIG. 6 is a block diagram of another example of a radio frequency circuit assembly according to aspects of the present disclosure.

As described above, one example configuration for multi-band operation is to provide a plurality of dedicated power amplifier stages matched with corresponding filter stages for frequency specific amplification and filtering. These respective frequency specific paths may then be input into an antenna switch module (ASM) for selecting which one or more of these frequency specific paths are electrically coupled to the antenna at any one point in time. An example implementation of the concept of the present disclosure in this arrangement is illustrated in FIG. 6 with one frequency specific path being shown to be connected to an ASM 20. The remaining features of FIG. 6 correspond to those of FIG. 5 described above. It will be appreciated that further frequency specific paths would be connected to the ASM 20 in such a configuration, but only one path has been shown in FIG. 6 for simplicity.

Figure 7:
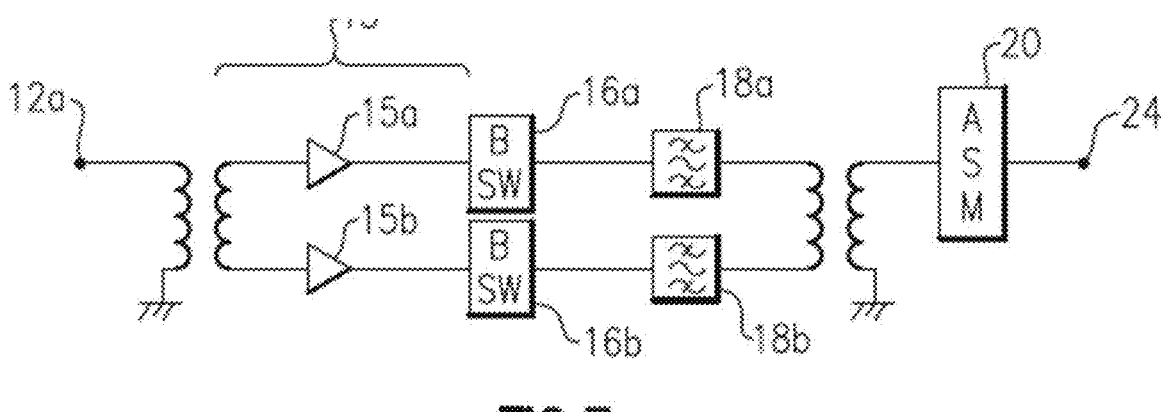
FIG. 7 is a block diagram of another example of a radio frequency circuit assembly according to aspects of the present disclosure.

FIG. 7 illustrates a further example implementation in accordance with the present disclosure in which a broadband power amplifier is coupled to a pair of band select switches 16*a* and 16*b* for routing the respective frequency bands of the amplified signal to respective frequency specific paths for further processing. The differential power amplifier 15 of FIG. 7 is configured to receive a broadband signal to be amplified from the signal contact 12*a* and to output the amplified broadband signal on the first and second paths to a first band select switch 16*a* and a second band select switch 16*b*.

The first band select switch 16*a* is configured to divide the broadband amplified signal from fundamental power amplifier 15*a* into the relevant frequency bands and to output each frequency band on a set of respective paths to a corresponding set of respective first band pass filters 18*a*. Similarly, the second band select switch 16*b* is configured to divide the (inverse) broadband amplified signal from fundamental power amplifier 15*b* into the relevant frequency bands and to output each frequency band on a set of respective paths to a corresponding set of respective first band pass filters 18*b*. In this manner, the differentially arranged pair of band select switches 16*a*, 16*b* may route the two halves of the respective frequency specific differential signals to appropriate differentially signaled frequency specific paths having respective differential filter pairs 18*a*, 18*b*. For each frequency path, the signals are then routed in the same manner as in FIG. 6, with the respective frequency specific differential signals being converted into respective frequency specific single ended signal by respective baluns before being input into an ASM 20 for selective routing to the antenna contact 24. This arrangement may be suitable for devices that operate on multiple bands, such as mobile devices as will be discussed in further detail below.

The passive band select switches in the radio frequency circuit assembly may also be a source of harmonics and that the arrangement illustrated in FIG. 7 advantageously provides cancellation of the even order harmonics generated by the band select switches 16*a* and 16*b*. This further improves the resistance of the circuit architecture to harmonic distortion without the need for aggressive frequency filtering and the associated insertion losses caused by such filtering. If any filtering is still required, then it can be targeted to the remaining aggressors much less aggressively and with a lower loss. This in turn improves the power consumption performance of the circuit as described above.

While the differential signal is shown as being carried through from the power amplifier stage 15 to the pair of band select switches and further to the pair of band pass filters 18*a*, 18*b*, it will be appreciated that one or more baluns could be included between these components to provide output impedance matching as illustrated in FIG. 6.

Alternatively, a single band select switch may be used by using a balun to convert the output of the differential amplifier 15 to a single ended signal to feed the single band select switch. Respective baluns may then be implemented to convert the respective outputs of the single band select switch back into a differential signal for feeding the input of the differential filter arrangement.

Figure 8:
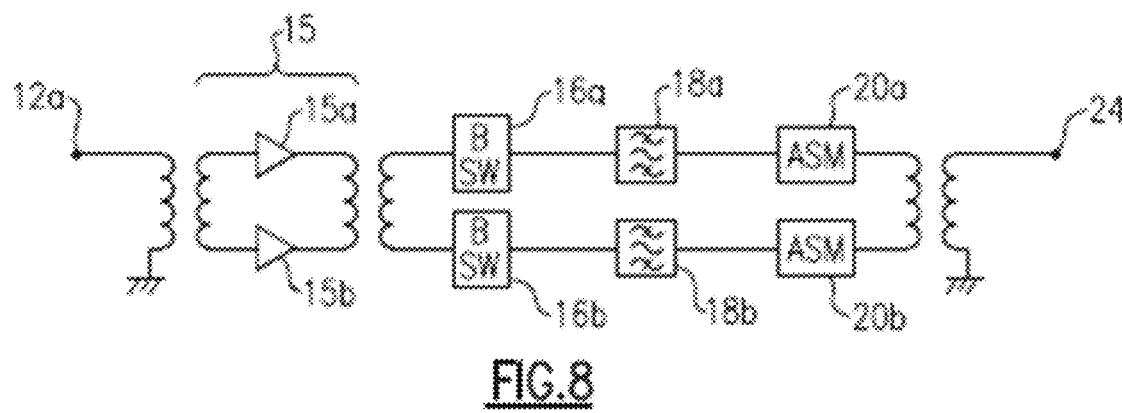
FIG. 8 is a block diagram of another example of a radio frequency circuit assembly according to aspects of the present disclosure.

FIG. 8 illustrates a further example implementation in accordance with the present disclosure in which a pair of ASMs are arranged differentially in the differential portion of the circuit assembly architecture. Other aspects may be implemented as discussed above in relation to FIG. 7. Specifically, the differential power amplifier 15 of FIG. 7 is configured to receive a broadband signal to be amplified from the signal contact 12*a* and to output the amplified broadband signal on the first and second paths to a first band select switch 16*a* and a second band select switch 16*b*.

The pair of band select switches are configured to divide the broadband differential amplified signal from fundamental power amplifier 15*a* into the relevant frequency bands and to output the differential signals for each frequency band on a set of respective differential paths to a corresponding set differential filters. The output of each differential filter arrangement is then sent to the differential pair of ASMs. Although FIG. 8 only illustrates a single differential output of the band select switch pair into a single pair of differential filters and onto the pair of ASMs, it will be appreciated that this is simply for ease of representation and that, in practice, the band select switch may output multiple pairs of differential signals for frequency specific processing (including the respective differential filters 18*a*, 18*b*), with these pairs of differential signals then being received at the pair of ASMs for selective routing to the antenna contact 24.

The passive ASMs in the radio frequency circuit assembly may also be a source of harmonics and the arrangement illustrated in FIG. 8 provides cancellation of the even order harmonics generated by the ASMs 20*a* and 20*b*. This further improves the resistance of the circuit architecture to harmonic distortion without the need for aggressive frequency filtering and the associated insertion losses caused by such filtering. If any filtering is still required, then it can be targeted much less aggressively and with a lower loss. This in turn improves the power consumption performance of the circuit as described above.

While the differential signal is shown as being carried through from the pair of band select switches to the pair of band pass filters 18*a*, 18*b*, and further to the pair of ASMs 20*a*, 20*b*, it will be appreciated that one or more baluns could be included between these components, for example to provide further output impedance matching in the circuit.

Figure 9:
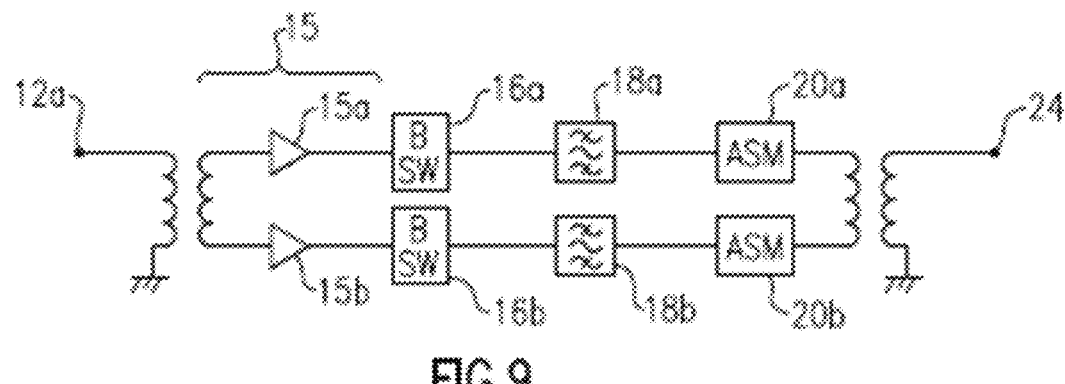
FIG. 9 is a block diagram of another example of a radio frequency circuit assembly according to aspects of the present disclosure.

FIG. 9 illustrates a further example implementation in accordance with the present disclosure in which the radio frequency circuit assembly corresponds to that of FIG. 8, except that the differential signal is carried all the way through from the differential power amplifier stage 15 to the pair of ASMs 20*a*, 20*b* via the multiple frequency specific paths (only one frequency specific path being illustrated in FIG. 9 for clarity). In this configuration, the conversion from differential to single ended signaling is performed at the balun between the output of the pair of ASMs 20*a*, 20*b* and the antenna contact 24.

The above disclosure has focused on the implementation of arrangements having differential filters (and other passive components) fed by the output of a differential power amplifier stage 15; however, it will be appreciated that the teaching of the present disclosure can also be implemented in radio frequency circuit assemblies comprising a single ended power amplifier 14.

Figure 10:
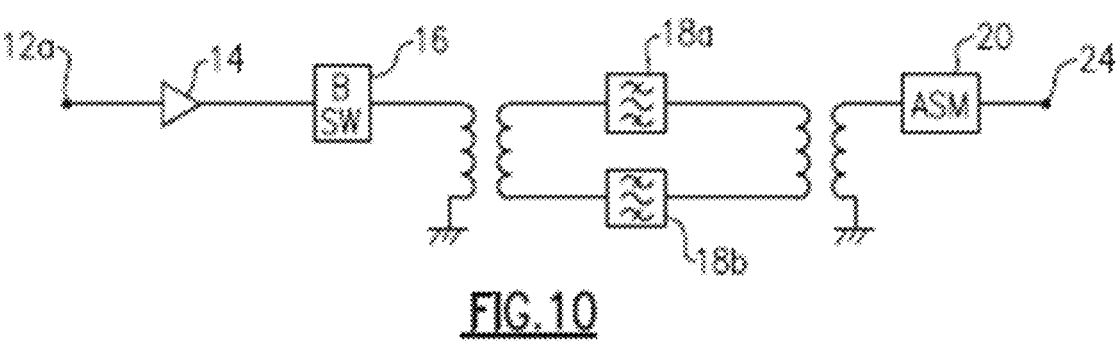
FIG. 10 is a block diagram of another example of a radio frequency circuit assembly according to aspects of the present disclosure.

An example implementation of this is shown in FIG. 10, in which an RF signal to be amplified is received at a signal contact 12*a* and passed to a single ended power amplifier 14 for amplification. In this example, the single ended power amplifier 14 is configured to operate in a broadband mode and so the amplified output is then input into a band select switch 16 for routing the relevant frequency components of the broadband RF signal to respective frequency specific paths. Each of these frequency specific paths (only one path shown in the figure for ease of representation) are then converted into a differential signal at respective baluns before being fed into respective differential pairs of band pass filters 18*a*, 18*b*. These respective pairs of band pass filters may be tuned to pass the relevant in-band frequencies of the respective frequency specific paths. After the respective band pass filter pairs, each differential signal is converted back into a single ended signal at a respective further balun and the single ended signals are then input into the ASM 20 for selective routing to the antenna contact as described above.

Although the example of FIG. 10 illustrates the single ended power amplifier 14 in combination with a single band select switch 16 and a single ASM 20, the examples of each of FIGS. 5 to 9 may also be adapted to use a single ended power amplifier 14 instead of the illustrated differential power amplifier 15. In this manner, the example of FIG. 10 may also be adapted to implement a differential pair of band select switches 16*a*, 16*b*, and/or a differential pair of ASMs 20*a*, 20*b* with the location of the balun(s) being adapted accordingly.

Figure 11:
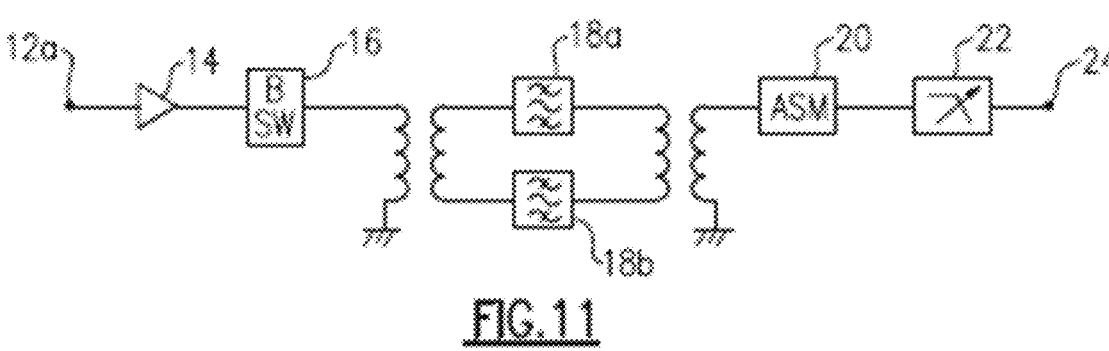
FIG. 11 is a block diagram of another example of a radio frequency circuit assembly according to aspects of the present disclosure.

While the examples of FIGS. 5 to 10 have been illustrated without a filter equivalent to the further filter 22 of FIGS. 3 and 4, it will be appreciated that further embodiments may include a further filter 22 between the antenna contact 24 and the ASM 20 or ASMs 20*a*, 20*b* of FIGS. 5 to 8. As described above, the concept of the present disclosure may reduce the filtering burden of the further filter 22 such that any filtering required may be less aggressive and therefore introduce less insertion loss into the signal chain. In one example, this further filter 22 may be able to be switched in and out of the circuit and/or have programmable/tunable characteristics depending on the configuration of the ASM at that point in time, e.g. which frequency bands are coupled to the antenna contact 24 at that moment in time. FIG. 11 illustrates this adaptation with respect to the configuration of FIG. 10. This adapted configuration enables the further filter 22 to be switched out during a period of time where a frequency band being operated does not have a second order harmonic that falls in or near to a victim band for example. This would further reduce the losses for those bands where the further filter 22 may be switched out.

FIG. 12 illustrates a further example implementation in accordance with the present disclosure in which the radio frequency circuit assembly includes differential signal paths in both transmit and receive paths. The circuit assembly can be configured for FDD operation, for example.

The transmit path from the transmit contact 12*a* through the band switch filters 16*a*, 16*b* is configured like that of FIG. 7. However, the transmit path of FIG. 12 includes duplex filters 19*a*, 19*b* each including one filter component (upper filter component) for the Tx path and another filter component (lower filter component) for the Rx path, allowing for FDD operation. Like the transmit assemblies of other embodiments, including that of FIG. 7, the balun between the filters 19*a*, 19*b* and the ASM 20 converts the differential transmit signal to a single ended signal, and can cancel noise including harmonics generated by some or all of the power amplifier 15, the band switches 16*a*, 16*b*, and the filters 19*a*, 19*b*.

The receive path extends from the antenna contact 24 to the receive signal contact 12*b*. A single ended receive signal provided by the antenna (not shown) is switched by the ASM 20 to a single ended, unbalanced side of the balun, which provides balanced differential receive signals to the pair of duplex filters 19*a*, 19*b*. The Rx filter component of each of the duplex filters 19*a*, 19*b* provides a filtered version of the differential receive signal to the respective differential amplifier components 26*a*, 26*b* of the LNA 26, which can be in a push-pull configuration, for example. The LNA 26 amplifies the differential receive signal, and the balun converts the amplified differential receive signal to a single-ended signal. The balun can cancel noise including harmonics generated by some or all of the Rx components of the filters 19*a*, 19*b* and the LNA 26.

While not illustrated, certain modifications to the embodiment of FIG. 12 are possible. For example, in some embodiments, the receive path can include other components, such as a pair band switches in the differential receive path (e.g., between the filters 19*a*, 19*b* and the LNA components 26*a*, 26*b*). A pair of ASMs can be included in the differential signal path (e.g., between the antenna-side balun and the switches 19*a*, 19*b*). Moreover, the transmit power amplifier in some other embodiments can be a single ended power amplifier positioned between the transmit contact 12*a* and the balun. In some implementations, the LNA can be a single ended amplifier positioned after the balun.

Figure 13A:
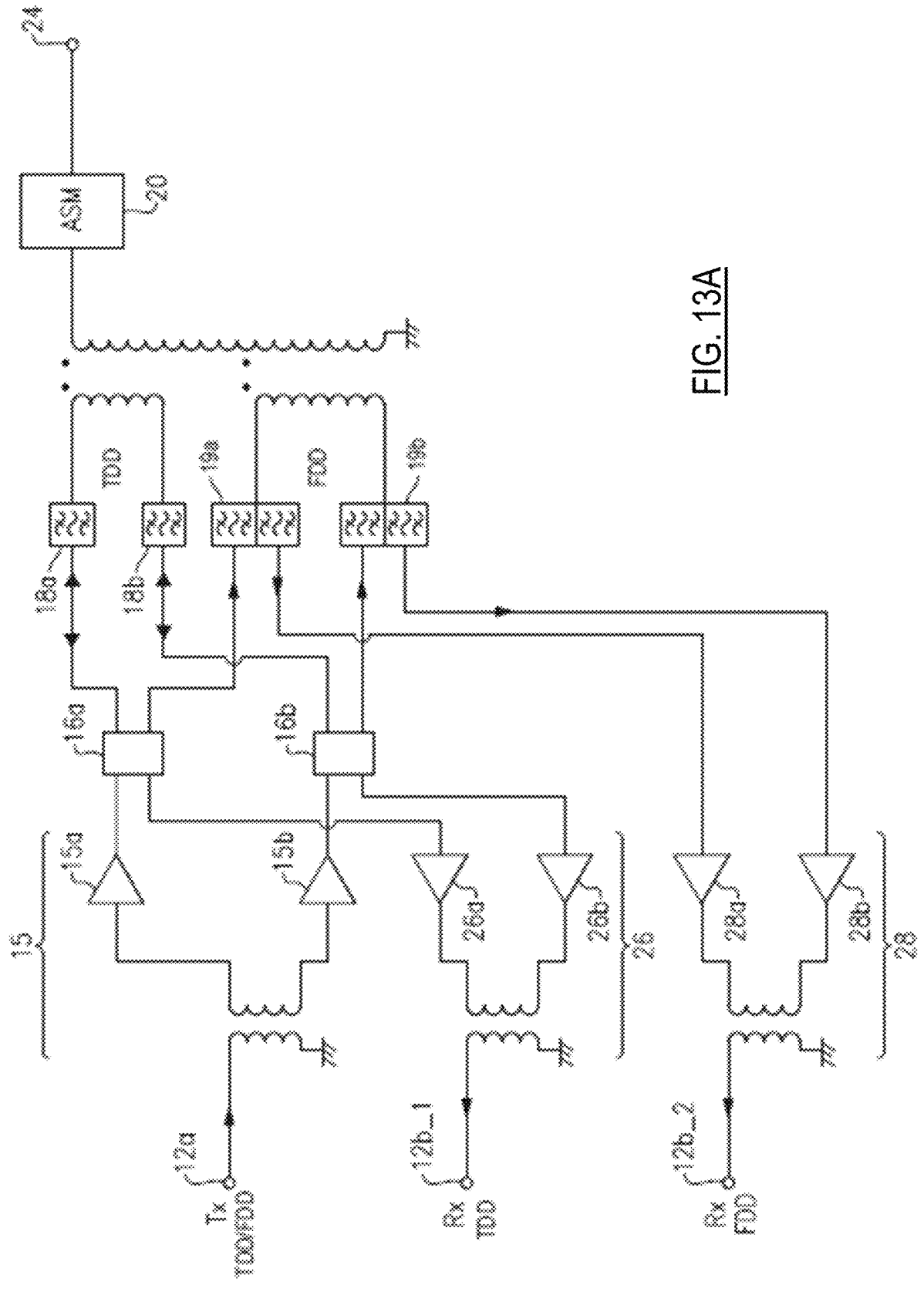

FIG. 13A shows another embodiment in which the radio frequency circuit assembly includes differential signal paths in both transmit and receive paths. The embodiment of FIG. 13A illustrates multiple differential receive paths, where the assembly can be configured for TDD or FDD operation.

The antenna-side balun includes first and second primary coils mutually coupled to a single secondary coil. The first primary coil is connected to the TDD filters 18*a*, 18*b*, which can be bi-directional filters used in TDD operation during both transmit and receive time slots. The second primary coil is connected to the duplex filters 19*a*, 19*b*, which are used in FDD operation. The secondary coil is connected to the ASM 20.

During FDD operation, the transmit path is configured generally like the transmit path of FIG. 12. The band switches 16*a*, 16*b* are controlled to provide the amplified differential transmit signals from the power amplifier components 15*a*, 15*b* to the Tx filter components (upper filter components) of the respective duplex filters 19*a*, 19*b*. The antenna-side balun converts the differential transmit signal provided on the second primary coil to a single-ended transmit signal on the secondary coil, and cancels noise including harmonics generated by some or all of the power amplifier 15, the band switches 16*a*, 16*b*, and the Tx components (upper filter components) of the respective duplex filters 19*a*, 19*b*. The Rx FDD path is configured generally like the receive path of FIG. 12. The Rx filter component (lower filter components) of each of the duplex filters 19*a*, 19*b* provides a filtered version of the differential receive signal to the respective differential amplifier components 28*a*, 28*b* of the Rx FDD LNA 28, which can be in a push-pull configuration. The receive-side balun of the Rx FDD path converts the differential FDD receive signal to a single-ended receive signal, and cancels noise including harmonics generated by the Rx FDD LNA 28 and the Rx components (lower filter components) of the respective duplex filters 19*a*, 19*b*.

For TDD operation, during transmit time slots, the band switches 16*a*, 16*b* are controlled to provide the amplified differential transmit signals from the power amplifier components 15*a*, 15*b* to the TDD filters 18*a*, 18*b*. The antenna-side balun converts the differential transmit signal on the first primary coil to a single-ended transmit signal on the secondary coil, and cancels noise including harmonics generated by some or all of the power amplifier 15, the band switches 16*a*, 16*b*, and the TDD filters 18*a*, 18*b*. During receive time slots, the band switches 16*a*, 16*b* are controlled to provide receive signals filtered by the TDD filters 18*a*, 18*b* to the differential components 26*a*, 26*b* of the Rx TDD LNA 26. The receive-side balun of the Rx TDD path cancels noise including harmonics generated by the Rx TDD LNA 26 and the respective TDD filters 18*a*, 18*b*.

Figure 13B:
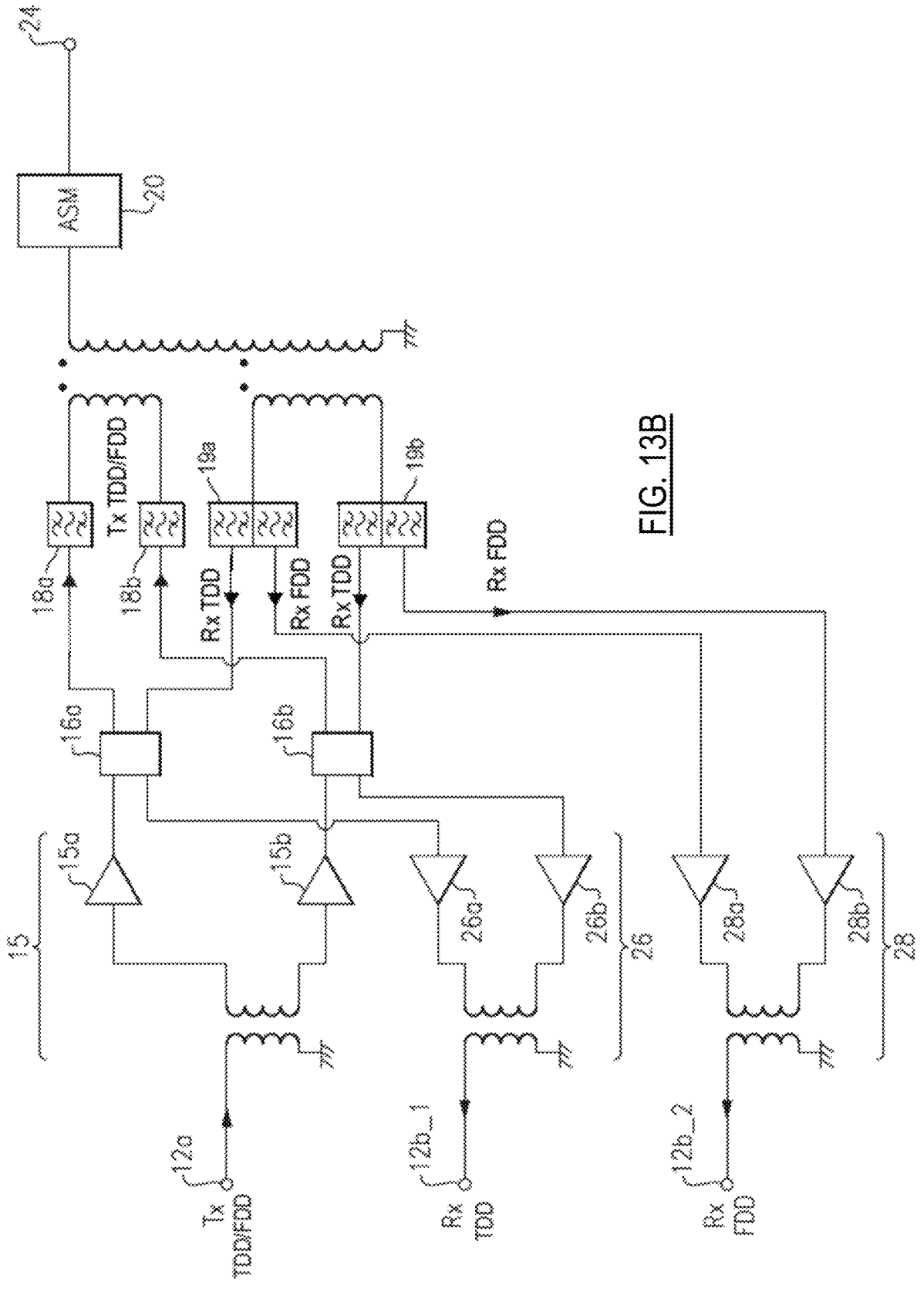

FIG. 13B shows another embodiment in which the radio frequency circuit assembly includes differential signal paths in both transmit and receive paths. The embodiment of FIG. 13B illustrates multiple differential receive paths, where the assembly can be configured for TDD or FDD operation, and is similar to the embodiment of FIG. 13A. However, in the embodiment of FIG. 13B, the paths including the filters 18*a*, 18*b* are used for both TDD Tx and FDD Tx operation, instead of being dedicated to TDD operation as in FIG. 13A, and the filters 19*a*, 19*b* are used in both Rx FDD and Rx TDD operations, instead of being dedicated to only FDD operation as in FIG. 13A.

During FDD operation, the band switches 16*a*, 16*b* are controlled to provide the amplified differential transmit signals from the power amplifier components 15*a*, 15*b* to the transmit filters 18*a*, 18*b*. The antenna-side balun converts the differential transmit signal provided on the first primary coil to a single-ended transmit signal on the secondary coil, and cancels noise including harmonics generated by some or all of the power amplifier 15, the band switches 16*a*, 16*b*, and the transmit filters 18*a*, 18*b*. The Rx FDD filter component (lower component) of each of the duplex filters 19*a*, 19*b* provides a filtered version of the differential receive signal to the respective differential amplifier components 28*a*, 28*b* of the Rx FDD LNA 28, which can be in a push-pull configuration. The receive-side balun of the Rx FDD path converts the differential FDD receive signal to a single-ended receive signal, and cancels noise including harmonics generated by the Rx FDD LNA 28 and the Rx FDD components (lower filter components) of the respective duplex filters 19*a*, 19*b*.

For TDD operation, during transmit time slots, the band switches 16*a*, 16*b* are controlled to provide the amplified differential transmit signals from the power amplifier components 15*a*, 15*b* to the transmit filters 18*a*, 18*b*. The antenna-side balun converts the differential transmit signal on the first primary coil to a single-ended transmit signal on the secondary coil, and cancels noise including harmonics generated by some or all of the power amplifier 15, the band switches 16*a*, 16*b*, and the transmit filters 18*a*, 18*b*. During receive time slots, the band switches 16*a*, 16*b* are controlled to provide receive signals filtered by the Rx TDD filter component (upper component) of each of the duplex filters 19*a*, 19*b* to the differential components 26*a*, 26*b* of the Rx TDD LNA 26. The receive-side balun of the Rx TDD path cancels noise including harmonics generated by the Rx TDD LNA 26 and the Rx components of the respective duplex filters 19*a*, 19*b*.

While not illustrated, certain modifications to the embodiments of FIG. 13A and FIG. 13B are possible. For example, ASMs can be included in the differential Tx and/or Rx signal paths instead of or in addition to the single-ended path. Moreover, the transmit power amplifier in some other embodiments can be a single ended power amplifier positioned between the transmit contact 12*a* and the antenna-side balun. Depending on the implementation, the LNA 26 and/or the LNA 28 can be single ended LNAs positioned after the respective receive path baluns.

Radio frequency circuit assemblies disclosed herein can be implemented in the front-end modules of wireless communication devices. The radio frequency circuit assemblies may be implemented in a discrete form with constituent discrete components (e.g. the power amplifier components, the acoustic filter components, the ASM, the LNA, switches, and/or the baluns) formed directly on the printed circuit board (PCB) of the wireless communication device. Alternatively, an integrated module, such as a multi-chip module (MCM), may include each of these components, with the components either being patterned directly into the MCM PCB, or attached via dies. The finished module may then be over molded for protection and packaging.

Figure 14:
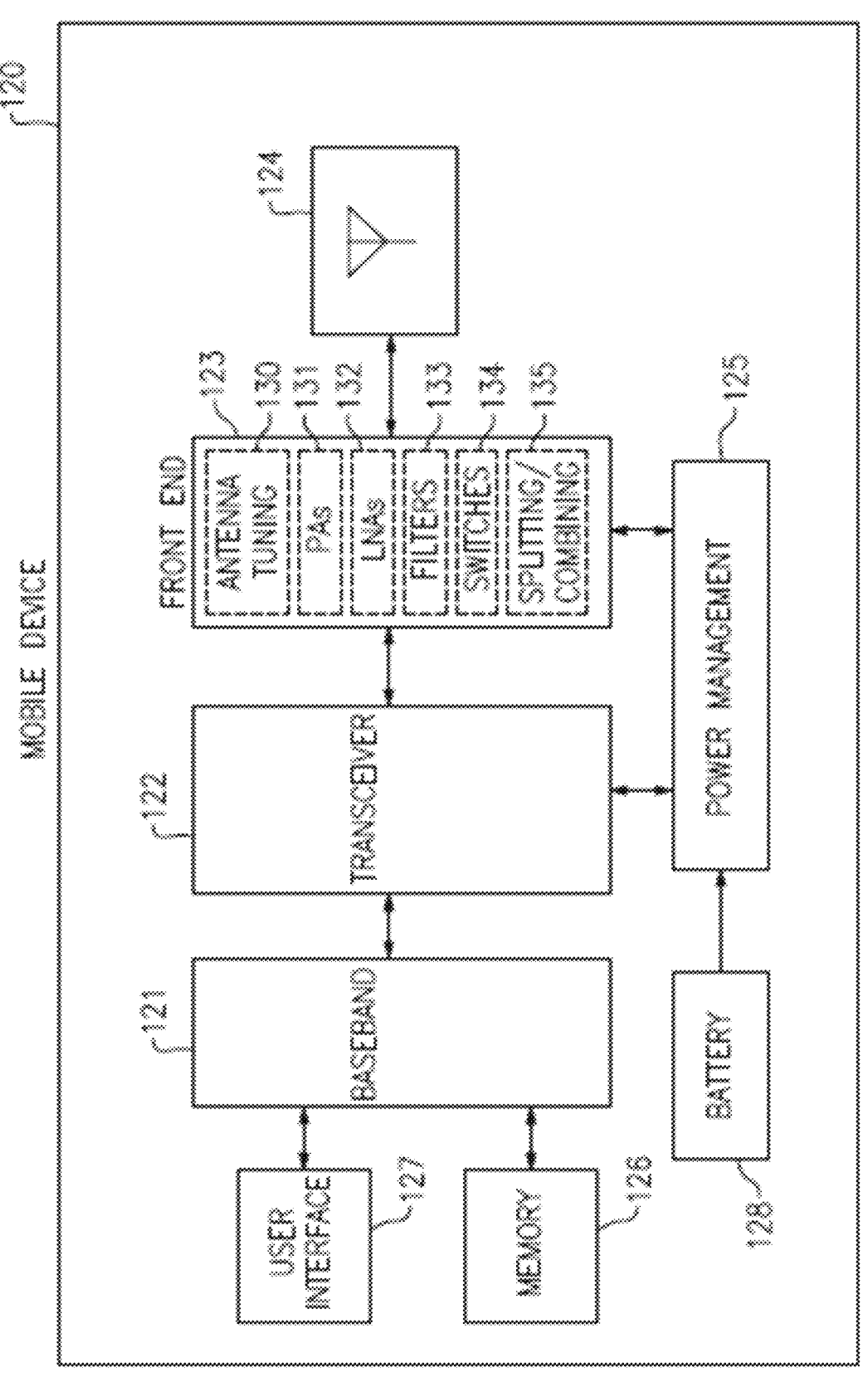
FIG. 14 is a schematic block diagram of one example of a wireless communication device that includes a radio frequency circuit assembly according to aspects of the present disclosure.

FIG. 14 is a schematic block diagram of a wireless communication device 120 that includes a radio frequency circuit assembly according to an embodiment. The wireless communication device 120 can be a mobile device. The wireless communication device 120 can be any suitable wireless communication device. For instance, a wireless communication device 120 can be a mobile phone, such as a smart phone. As illustrated, the wireless communication device 120 includes a baseband system 121, a transceiver 122, a front end system 123, one or more antennas 124, a power management system 125, a memory 126, a user interface 127, and a battery 128.

The wireless communication device 120 can communicate using a wide variety of communications technologies, including, but not limited to, 2G, 3G, 4G (including LTE, LTE-Advanced, and/or LTE-Advanced Pro), 5G NR, WLAN (for instance, Wi-Fi), WPAN (for instance, Bluetooth and/or ZigBee), WMAN (for instance, WiMax), and/or GPS technologies.

The transceiver 122 generates RF signals for transmission and processes incoming RF signals received from the antennas 124. Various functionalities associated with the transmission and receiving of RF signals can be achieved by one or more components that are collectively represented in FIG. 14 as the transceiver 122. In one example, separate components (for instance, separate circuits or dies) can be provided for handling certain types of RF signals.

The front end system 123 aids in conditioning signals provided to and/or received from the antennas 124. In the illustrated embodiment, the front end system 123 includes antenna tuning circuitry 130, power amplifiers (PAs) 131, low noise amplifiers (LNAs) 132, filters 133, switches 134, and signal splitting/combining circuitry 135. However, other implementations are possible. The front end system 123 can include one or more radio frequency circuit assemblies in accordance with any suitable principles and advantages disclosed therein. For example, the filters 133 may comprise differentially arranged band pass filters arranged within a radio frequency circuit assembly in accordance with any suitable principles and advantages disclosed herein.

The front end system 123 can provide a number of functionalities, including, but not limited to, amplifying signals for transmission, amplifying received signals, filtering signals, switching between different bands, switching between different power modes, switching between transmission and receiving modes, duplexing of signals, multiplexing of signals, or any suitable combination thereof.

In certain implementations, the wireless communication device 120 supports carrier aggregation, thereby providing flexibility to increase peak data rates. Carrier aggregation can be used for Frequency Division Duplexing (FDD) and/or Time Division Duplexing (TDD), and may be used to aggregate a plurality of carriers and/or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 124 can include antennas used for a wide variety of types of communications. For example, the antennas 124 can include antennas for transmitting and/or receiving signals associated with a wide variety of frequencies and communications standards.

In certain implementations, the antennas 124 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The wireless communication device 120 can operate with beamforming in certain implementations. For example, the front end system 123 can include amplifiers having controllable gain and phase shifters having controllable phase to provide beam formation and directivity for transmission and/or reception of signals using the antennas 124. For example, in the context of signal transmission, the amplitude and phases of the transmit signals provided to the antennas 124 are controlled such that radiated signals from the antennas 124 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 124 from a particular direction. In certain implementations, the antennas 124 include one or more arrays of antenna elements to enhance beamforming.

The baseband system 121 is coupled to the user interface 127 to facilitate processing of various user input and output (I/O), such as voice and data. The baseband system 121 provides the transceiver 122 with digital representations of transmit signals, which the transceiver 122 processes to generate RF signals for transmission. The baseband system 121 also processes digital representations of received signals provided by the transceiver 122. As shown in FIG. 14, the baseband system 121 is coupled to the memory 126 of facilitate operation of the wireless communication device 120.

The memory 126 can be used for a wide variety of purposes, such as storing data and/or instructions to facilitate the operation of the wireless communication device 120 and/or to provide storage of user information.

The power management system 125 provides a number of power management functions of the wireless communication device 120. In certain implementations, the power management system 125 includes a PA supply control circuit that controls the supply voltages of the power amplifiers 131. For example, the power management system 125 can be configured to change the supply voltage(s) provided to one or more of the power amplifiers 131 to improve efficiency, such as power added efficiency (PAE).

As shown in FIG. 14, the power management system 125 receives a battery voltage from the battery 128. The battery 128 can be any suitable battery for use in the wireless communication device 120, including, for example, a lithium-ion battery.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes example embodiments, the teachings described herein can be applied to a variety of structures. Any of the principles and advantages discussed herein can be implemented in association with RF circuits configured to process signals having a frequency in a range from about 30 kHz to 300 GHz, such as in a frequency range from about 400 MHz to 8.5 GHz or in a frequency range from about 400 MHz to 5 GHz.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a robot such as an industrial robot, an Internet of things device, a stereo system, a digital music player, a radio, a camera such as a digital camera, a portable memory chip, a home appliance such as a washer or a dryer, a peripheral device, a wrist watch, a clock, etc. Further, the electronic devices can include unfinished products.

Conditional language used herein, such as, among others, "can," "could," "might," "may," "e.g.," "for example", "such as" and the like, unless specifically stated otherwise, or otherwise understood within the context as used, is generally intended to convey that certain embodiments include, while other embodiments do not include, certain features, elements and/or states. The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively.

The examples shown in the figures illustrate the filter components or filtering stages as discrete "blocks". Those skilled in the art will appreciate, given the benefit of this disclosure, that any or all of the filters shown in the various examples may be made up of many stages and/or combined or share components in different physical implementations. Accordingly, the examples shown in FIGS. 5 to 10 are intended to be functional illustrations and not limiting in any aspect with respect to actual implementations of the radio frequency circuit assembly or front-end module. Aspects and embodiments provide a noise cancellation approach that can be designed into the overall front-end module configuration such that the overall filter out-of-band attenuations required can be relaxed, requirements on some or all the filter sections may be relaxed to provide more optimal and lower insertion losses, and the net insertion loss and out-of-band attenuation/isolation properties of the entire front-end module may exhibit less loss, more isolation, and more out-of-band attenuation where desired.

While certain embodiments have been described, these embodiments have been presented by way of example only, and are not intended to limit the scope of the disclosure. Indeed, the novel resonators, filters, modules, devices, wireless communication devices, apparatus, and systems described herein may be embodied in a variety of other forms. Furthermore, various omissions, substitutions and changes in the form of the resonators, filters, modules, devices, wireless communication devices, apparatus, and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and/or acts of the various embodiments described above can be combined to provide further embodiments. Accordingly, the foregoing description and drawings are by way of example only, and the scope of the disclosure should be determined from proper construction of the appended claims, and their equivalents.

What is claimed is:

1. A radio frequency circuit assembly, comprising:
a signal contact and an antenna contact;
an amplifier connected in a signal path between the signal contact and the antenna contact, the signal path between the amplifier and the antenna contact including a differentially signaled portion having a first path and a second path; and
a pair of band pass filters, a first band pass filter of the pair of band pass filters being connected in the first path of the differentially signaled portion and a second band pass filter of the pair of band pass filters being connected in the second path of the differentially signaled portion, the first band pass filter and the second band pass filter being acoustic wave filters.

2. The radio frequency circuit assembly of claim 1 wherein the first band pass filter and the second band pass filter are coupled to form a differential filter.

3. The radio frequency circuit assembly of claim 1 wherein the amplifier is a single ended amplifier.

4. A radio frequency circuit assembly, comprising:
a signal contact and an antenna contact;
an amplifier connected in a signal path between the signal contact and the antenna contact, the signal path between the amplifier and the antenna contact including a differentially signaled portion having a first path and a second path;
a pair of band pass filters, a first band pass filter of the pair of band pass filters being connected in the first path of the differentially signaled portion and a second band pass filter of the pair of band pass filters being connected in the second path of the differentially signaled portion; and
an antenna switch module connected in the signal path between a single ended output of the differentially signaled portion and the antenna contact.

5. The radio frequency circuit assembly of claim 4 wherein the first band pass filter and the second band pass filter are acoustic wave filters.

6. The radio frequency circuit assembly of claim 1 wherein the amplifier is a differential amplifier.

7. A radio frequency circuit assembly, comprising:
a signal contact and an antenna contact;
an amplifier connected in a signal path between the signal contact and the antenna contact, the signal path between the amplifier and the antenna contact including a differentially signaled portion having a first path and a second path, the amplifier being a differential amplifier;
a pair of band pass filters, a first band pass filter of the pair of band pass filters being connected in the first path of the differentially signaled portion and a second band pass filter of the pair of band pass filters being connected in the second path of the differentially signaled portion; and
a pair of band select switches coupled to respective differential outputs of the differential amplifier.

8. The radio frequency circuit assembly of claim 1 further comprising a pair of antenna switch modules each coupled to the antenna contact and to a respective output of the first band pass filter and the second band pass filter.

9. The radio frequency circuit assembly of claim 1 further comprising a tunable low pass filter connected in the signal path between a single ended output of the differentially signaled portion and the antenna contact.

10. A front-end module comprising:
a signal contact and an antenna contact;
an amplifier connected in a signal path between the signal contact and the antenna contact, the signal path between the amplifier and the antenna contact including a differentially signaled portion having a first path and a second path;
a pair of band pass filters, a first band pass filter of the pair of band pass filters being connected in the first path of the differentially signaled portion and a second band pass filter of the pair of band pass filters being connected in the second path of the differentially signaled portion; and
a pair of antenna switch modules each coupled to the antenna contact and to a respective output of the first band pass filter and the second band pass filter.

11. The front-end module of claim 10 wherein the first band pass filter and the second band pass filter are coupled to form a differential filter.

12. The front-end module of claim 10 wherein the first band pass filter and the second band pass filter are acoustic wave filters.

13. The front-end module of claim 10 wherein the amplifier is a single ended amplifier.

14. The front-end module of claim 10 wherein the amplifier is a differential amplifier.

15. The front-end module of claim 14 further comprising a pair of band select switches coupled to respective differential outputs of the differential amplifier.

16. A front-end module comprising:
a signal contact and an antenna contact;
an amplifier connected in a signal path between the signal contact and the antenna contact, the signal path between the amplifier and the antenna contact including a differentially signaled portion having a first path and a second path;
a pair of band pass filters, a first band pass filter of the pair of band pass filters being connected in the first path of the differentially signaled portion and a second band pass filter of the pair of band pass filters being connected in the second path of the differentially signaled portion;
a pair of band select switches coupled to respective outputs of the amplifier; and
a pair of antenna switch modules, the pair of band pass filters being coupled to respective outputs of the pair of band select switches, the pair of antenna switch modules being coupled to the respective outputs of the pair of band pass filters, and the pair of antenna switch modules being coupled to the antenna contact.

17. The front-end module of claim 10 further comprising a tunable low pass filter connected in the signal path between a single ended output of the differentially signaled portion and the antenna contact.

18. The radio frequency circuit assembly of claim 5 wherein the amplifier is a differential amplifier.

19. The radio frequency circuit assembly of claim 1 further comprising an antenna switch module connected in the signal path between a single ended output of the differentially signaled portion and the antenna contact.

20. The radio frequency circuit assembly of claim 5 wherein the first band pass filter and the second band pass filter are coupled to form a differential filter.

\* \* \* \* \*